United States Patent [19]
Swartz

[11] 3,753,053

[45] Aug. 14, 1973

[54] SEMICONDUCTOR ASSEMBLY

[75] Inventor: George Allan Swartz, Princeton, N.J.

[73] Assignee: RCA Corporation, New York, N.Y.

[22] Filed: Oct. 30, 1972

[21] Appl. No.: 302,291

[52] U.S. Cl. ..... 317/234 R, 317/234 E, 317/234 N, 317/234 P, 317/101 A

[51] Int. Cl. ..... H01l 3/00, H01k 5/00

[58] Field of Search ..... 317/234, 3, 3.1, 317/4, 4.1, 5, 5.3, 5.4, 6, 101 A

[56] References Cited

UNITED STATES PATENTS

| | | | |
|---|---|---|---|
| 2,890,395 | 6/1959 | Lathrope et al. | 317/234 N |
| 3,343,107 | 9/1967 | Goligatly | 317/234 G |
| 3,553,610 | 1/1971 | Brenner et al. | 316/234 G |
| 3,566,459 | 3/1971 | Rindner et al. | 317/234 N |

FOREIGN PATENTS OR APPLICATIONS

| | | | |
|---|---|---|---|
| 19,182 | 7/1966 | Japan | 317/234 G |

*Primary Examiner*—John W. Huckert
*Assistant Examiner*—Andrew J. James
*Attorney*—Glenn H. Bruestle et al.

[57] ABSTRACT

A semiconductor assembly for use with a high frequency semiconductor device is presented which uses at least one stand-off having a conductive surface which overhangs the semiconductor device and which has pressure-absorbing contacts mounted thereon thereby protecting the semiconductor from direct pressure while providing for electrical contact to the semiconductor and allowing for very short leads from the stand-off to the semiconductor device.

16 Claims, 1 Drawing Figure

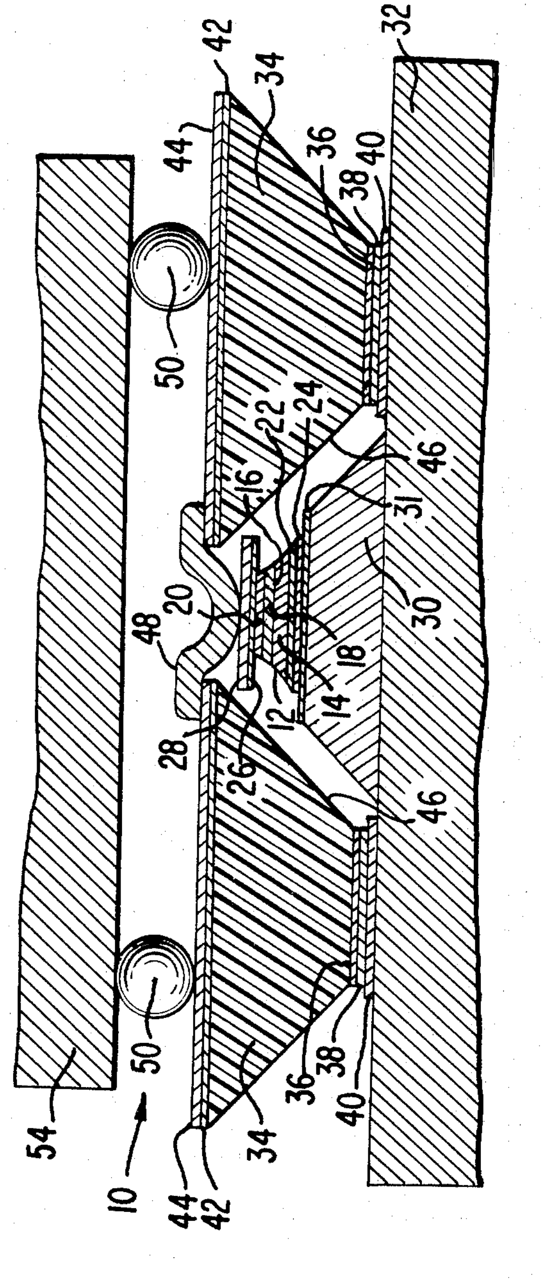
42
34
32
44
36
40
38
50
22
24
16
46
31
48
20
30
18
14
12
28
26
54
10

SEMICONDUCTOR ASSEMBLY

BACKGROUND OF THE INVENTION

The present invention relates to semiconductor assemblies for providing electrical contact to semiconductor devices and more particularly to semiconductor assemblies for use with high frequency semiconductor devices.

In the manufacture of semiconductor devices a method of electrically connecting the semiconductor devices to the outside world is needed. In the past, this need has been met by such means as direct pressure contacts to the semiconductor device as well as by indirect pressure contacts sometimes employing stand-offs. Direct pressure upon semiconductor devices used at high frequency is undesirable because of the small size needed for semiconductor devices which are used at such frequencies and because of the great likelihood of damaging such small devices by direct pressure.

Heretofore, some semiconductor assemblies have met the need of providing electrical contact to the semiconductor device without applying direct pressure upon the device through the use of stand-offs. However, in these prior assemblies the stand-offs have been separated from the semiconductor device requiring a wire lead from the stand-off to the device. In many cases, the characteristics of these wire leads at high frequencies have nullified the utility of the particular semiconductor device being used due to the relatively high inductance presented by the wire leads. This phenomenon has particularly been present in semiconductor devices which are used at microwave frequencies. In fact, at microwave frequencies some semiconductor devices which would otherwise be operable and useful have been found to be unuseable because of the relatively high lead inductance presented by the wire leads running from the stand-off to the semiconductor device.

Ideally, an active device operated as a high frequency oscillator should have purely capacitive characteristics. The inductive impedance presented by the leads connected to the semiconductor device negates the purely capacitive characteristics of the device and creates and LC characteristic which limits the high frequency operation of the semiconductor devices. As the frequency of operation approaches the frequency determined by this lead impedance the device will cease operation.

SUMMARY OF THE INVENTION

A semiconductor assembly which comprises a base, a semiconductor device mounted on the base, at least one stand-off which is closely spaced to the base and which has an electrically conductive contact surface which overhangs the semiconductor device, a pressure-absorbing contact mounted on the contact surface, and means for electrically connecting the contact surface on the stand-off to the semiconductor device.

BRIEF DESCRIPTION OF THE DRAWING

The FIGURE of the drawing is a sectional view of one embodiment of the semiconductor assembly of the present invention being used with an IMPATT diode.

DETAILED DESCRIPTION

Referring generally to the drawing a semiconductor assembly 10 is shown in use with an IMPATT diode 12. The IMPATT diode 12 does not constitute a part of the present invention and is used only for illustrative purposes. The present invention may be used with any type of semiconductor device such as a diode or a transistor and is particularly useful for a semiconductor device which is to be used at a frequency which is high enough that lead inductance will be a non-negligible consideration. IMPATT diode 12 is a high frequency semiconductor device which may be used as a microwave oscillator. IMPATT diodes are generally known in the semiconductor art. The IMPATT diode 12 of the preferred embodiment is fabricated of silicon semiconductor material. However, any other semiconductor material such as a Group III–V material or germanium might also be used, and this will not affect the utility of the present invention.

IMPATT diode 12 comprises a P type semiconductor conductivity region 14, an N type conductivity region 18 forming a PN junction 16 with the P type region 14, and an N+ conductivity region 20. The P type conductivity region 14 has a chromium layer 22 deposited thereon. The chromium layer 22 is used because chromium adheres well to semiconductor material such as silicon which comprises the IMPATT diode 12. In addition, chromium is a conductive material which allows good electrical contact to the semiconductor material used to fabricate the IMPATT diode 12 and which will provide a barrier to prevent diffusion of gold from a gold contact 24 which is deposited onto the chromium layer 22. The chromium layer 22 can be deposited onto the IMPATT diode 12 by any well-known technique for depositing chromium such as by evaporating chromium in a vacuum and condensing the metal vapor upon the P type layer 14. A gold layer 24 is deposited upon the chromium layer 22. This gold layer 24 is used to provide good electrical contact to the IMPATT diode 12. The gold layer 24 may also be deposited in the same manner or it may be electroplated upon the chromium layer 22.

In the same manner and for the same reasons, a chromium layer 26 and a gold layer 28 are deposited on the top of the IMPATT diode 12. The IMPATT diode 12 is then bonded to an electrically conductive base which may be a heat sink 30 in order to allow heat to flow from the IMPATT diode 12 in order to prevent the diode 12 from burning out when power is applied to it. The heat sink 30 is made of a material which is electrically conductive and which is a good conductor of heat, such as copper or silver. In order to bond the IMPATT diode 12 to the heat sink 30, the heat sink can have a gold layer 31 deposited onto its top surface and a thermocompression bond can be made. The IMPATT diode 12 together with the heat sink 30 may then be soldered to a mounting structure 32 which is made of an electrically conductive metal which is a good conductor of heat, such as copper or silver.

The semiconductor assembly 10 of the present invention employs at least one and may employ more than one stand-off 34 as shown in the preferred embodiment. Still more stand-offs may be used if desired, as their addition will lower the lead impedance and thereby increase the useful operating frequency of the semiconductor device used.

A stand-off 34 is comprised of a material which provides very good insulation at microwave frequencies such as quartz, Teflon, or glasses which have low loss insulating characteristics, especially those which have a high quartz content. The stand-off 34 may have any shape which will allow a surface of the stand-off 34 to overhang and be in close proximity with the gold surface 28 of the IMPATT diode 12. In the preferred embodiment, amorphous quartz is used for each of the stand-offs 34 which are substantially shaped like truncated cones. Each quartz stand-off 34 has two opposed planar surfaces upon which chromium adherence layers 36, 42 are deposited by any commonly-known method such as by vacuum evaporation, which has been previously described. Upon these chromium adherence layers 36, 42 gold layers 38, 44 are deposited by any commonly-known method such as by vacuum evaporation or by electroplating. Upon the surface of the mounting structure 32 a gold layer 40 is deposited by any commonly-known method such as by vacuum evaporation or by electroplating. The quartz stand-off 34 is bonded to the mounting structure 32. This may be achieved by a thermocompression bond.

The gold layer 44 on the surface of the stand-off 34 which is exposed overhangs the top gold layer 28 of the IMPATT diode 12 when both of the stand-offs 34 and the IMPATT diode 12 are bonded to the mounting structure 32. Each quartz stand-off 34 in the preferred embodiment has an inclined side wall 46 which enables the gold contact layer 44 of the stand-off 34 to overhang and be in close proximity with the gold layer 28 of the IMPATT diode 12. A very short contact wire or ribbon 48, which is preferably made of gold, is bonded to the gold contact layer 44 of the quartz stand-off 34 and to the gold contact layer 28 of the IMPATT diode 12. This gold contact ribbon 48 may typically be 1 mil by 3 mils. The bonding may be done by thermocompression if a gold ribbon 48 is used or ultrasonically if a gold wire is used. The overhang due to the inclined side wall 46 of the quartz stand-off 34 allows a very short length of contact ribbon 48 to be used between the gold contact layer 44 of the quartz stand-off 34 and the gold contact layer 28 of the IMPATT diode 12. Because of this very short length, which may typically be on the order of 5 mils or less, a very small inductive impedance will be presented by the gold contact ribbon 48. This allows the IMPATT diode 12 to be operated at a much higher frequency than would be possible were it not for the overhang of the gold contact layer 44 of the quartz stand-offs 34. If two stand-offs 34 are used, a single contact ribbon 48 may connect each of them to the IMPATT diode 12 as shown in the drawing. This will further reduce the lead impedance of the contact ribbon 48 because the electrical effect is that of having two short leads connected in parallel. If more than two of the stand-offs 34 are used, the lead impedance of the contact ribbons 48 will be connected in parallel thereby further decreasing such lead impedance.

Also attached to the quartz stand-offs 34 are pressure-absorbing contacts 50 which may be in the form of balls or wires. These pressure-abosrbing balls 50 are of greater diameter than the thickness of the gold contact ribbon 48 and may typically be on the order of 3 mils in diameter. The pressure-absorbing balls 50 are made of good electrically conductive metal which is capable of absorbing applied pressure, such as gold. The gold balls 50 may be ultrasonically bonded to the gold layer 44 of the stand-offs 34. An electrical pressure contact 54 may then be lowered onto the gold pressure-absorbing balls 50 to provide electrical contact to the IMPATT diode 12. It will be seen that the semiconductor assembly 10 of the present invention takes all direct pressure off the IMPATT diode 12 by applying the direct pressure of the pressure contact 54 to the relatively thick gold pressure-absorbing balls 50.

Electrical connections to the IMPATT diode 12 are provided through the mounting structure 32 and the electrical contact 54. It will be seen that in addition to removing direct pressure from the IMPATT diode 12 while providing for electrical contact, the semiconductor assembly 10 allows for very short lengths of contact ribbon 48 to be used between the IMPATT diode 12 and the gold contact layer 44 of the semiconductor assembly 10. This allows the IMPATT diode 12 to be operated at much higher frequencies than would be possible without the use of the current invention.

I claim:

1. A semiconductor assembly comprising:

a. a base, b. a semiconductor device mounted on said base, c. at least one insulating stand-off closely spaced to said semiconductor device and having an electrically conductive contact surface overhanging said semiconductor device, d. a pressure-absorbing contact mounted on said contact surface, and e. means electrically connecting said contact surface on said insulating stand-off to said semiconductor device.

2. The semiconductor assembly of claim 1 wherein said base comprises a heat sink.

3. The semiconductor assembly of claim 1 wherein said base is electrically conductive and is electrically connected to said semiconductor device.

4. The semiconductor assembly of claim 1 further comprising a mounting structure upon which said base and said stand-off are mounted.

5. The semiconductor assembly of claim 4 wherein said base is a heat sink and said base and said mounting structure are electrically conductive and are electrically connected to said semiconductor device.

6. The semiconductor assembly of claim 5 wherein said insulating stand-off is substantially shaped like a truncated cone with a planar surface having the smaller area mounted on said mounting structure whereby the sloping side walls of said truncated cone are adjacent said base and the planar surface having the larger area of said truncated cone overhangs said semiconductor device.

7. The semiconductor assembly of claim 6 in which the planar surface of said truncated cone having the larger area is made electrically conductive by the deposition of a conductive metal thereon.

8. The semiconductor assembly of claim 7 including two such insulating stand-offs.

9. The semiconductor assembly of claim 1 wherein said means connecting said contact surface on said insulating stand-off to said semiconductor device comprises an electrically conductive contact ribbon.

10. The semiconductor assembly of claim 9 wherein said pressure-absorbing contact extends further from said contact surface than does said contact ribbon.

11. The semiconductor assembly of claim 10 wherein said pressure-absorbing contact is an electrically conductive ball having a greater diameter than the thickness of said contact ribbon.

12. The semiconductor assembly of claim 10 wherein said pressure-absorbing contact is an electrically conductive wire having a greater diameter than the thickness of said contact ribbon.

13. The semiconductor assembly of claim 1 wherein said means connecting said contact surface on said insulating stand-off to said semiconductor device comprises an electrically conductive wire.

14. The semiconductor assembly of claim 13 wherein said pressure-absorbing contact has a greater diameter than does said electrically conductive wire.

15. The semiconductor assembly of claim 14 wherein said pressure-absorbing contact is an electrically conductive wire having a diameter which is larger than the diameter of said wire.

16. The semiconductor assembly of claim 14 wherein said pressure-absorbing contact is an electrically conductive ball having a diameter which is larger than that of said wire.

* * * * *